(12) United States Patent
Saito

(10) Patent No.: US 6,225,556 B1
(45) Date of Patent: *May 1, 2001

(54) MAGNETIC SHIELD SHEET AND METHOD FOR MANUFACTURING THEREOF, AND CABLE USING THE SHEET

(75) Inventor: Akihiko Saito, Nagoya (JP)

(73) Assignee: Daido Tokushukou Kabushiki Kaisha, Nagoya (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/928,661

(22) Filed: Sep. 12, 1997

(30) Foreign Application Priority Data

Sep. 19, 1996 (JP) ................................... 8-247322

(51) Int. Cl.$^7$ ......................... H01B 1/00; H01B 11/00
(52) U.S. Cl. ........................ 174/36; 174/35; 174/34; 428/561; 148/668
(58) Field of Search ................ 174/35 MS, 34, 174/36; 428/561; 148/668

(56) References Cited

U.S. PATENT DOCUMENTS

| | | | |
|---|---|---|---|
| 4,992,329 | 2/1991 | Ishii et al. ............................. | 428/328 |
| 5,260,128 | 11/1993 | Ishii et al. ............................. | 428/328 |
| 5,326,646 | * 7/1994 | Nakashima et al. .................. | 428/561 |
| 5,462,809 | * 10/1995 | Berkowitz ............................. | 428/546 |
| 5,573,857 | * 11/1996 | Auger .................................... | 428/138 |
| 5,574,249 | * 11/1996 | Lindsay ................................ | 174/35 R |
| 5,585,196 | * 12/1996 | Inomata et al. ...................... | 428/557 |

* cited by examiner

Primary Examiner—William A. Cuchlinski, Jr.
Assistant Examiner—Ronnie Mancho
(74) Attorney, Agent, or Firm—Bacon & Thomas

(57) ABSTRACT

A sheet for shielding a room, conductive cables, magnetic recording media, inside shield rooms and other objects, from the effects of a magnetic field. The sheet is used as a magnetic shield by wrapping it around the objects or areas which need shielding from the effects of a magnetic field. The sheet is composed of a flexible magnetic shielding sheet of less than 100 μm thick and is made from alloys which have magnetic shielding capability such as alloys of Fe—Ni series and the like. The Fe—Ni series alloy contains 30 to 85 wt % Ni and also at least either one kind of Mo or Cu in the content of less than 8 wt %. Other than these, alloys of Fe—Cr—Al series and Fe—Co—V series are included. The magnetic shielding sheet 1 may also include an adhesive layer, film, or paper, laminated on at least one surface of the sheet. The sheet thus obtained is easily applicable for winding around the surface of a communication cable, making an envelope or a bag for keeping a floppy disk (FD), or shielding a room.

7 Claims, 23 Drawing Sheets

↓

↓

↓

APPLIED MAGNETIC FLUX DENSITY = 1G

APPLIED MAGNETIC FLUX DENSITY = 1G

F I G. 1 0 (C)
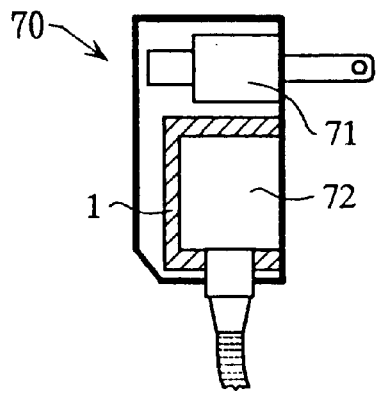
F I G. 1 0 (D)
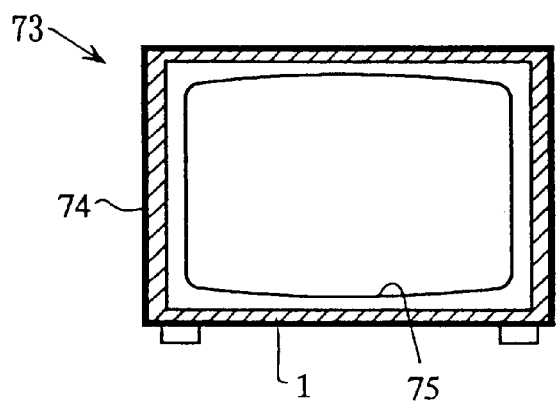
F I G. 1 0 (E)
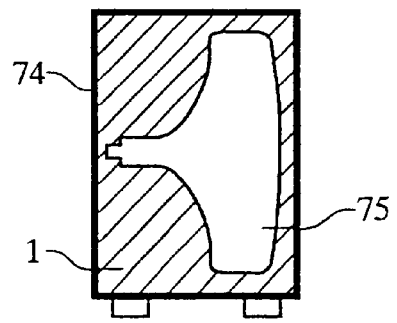

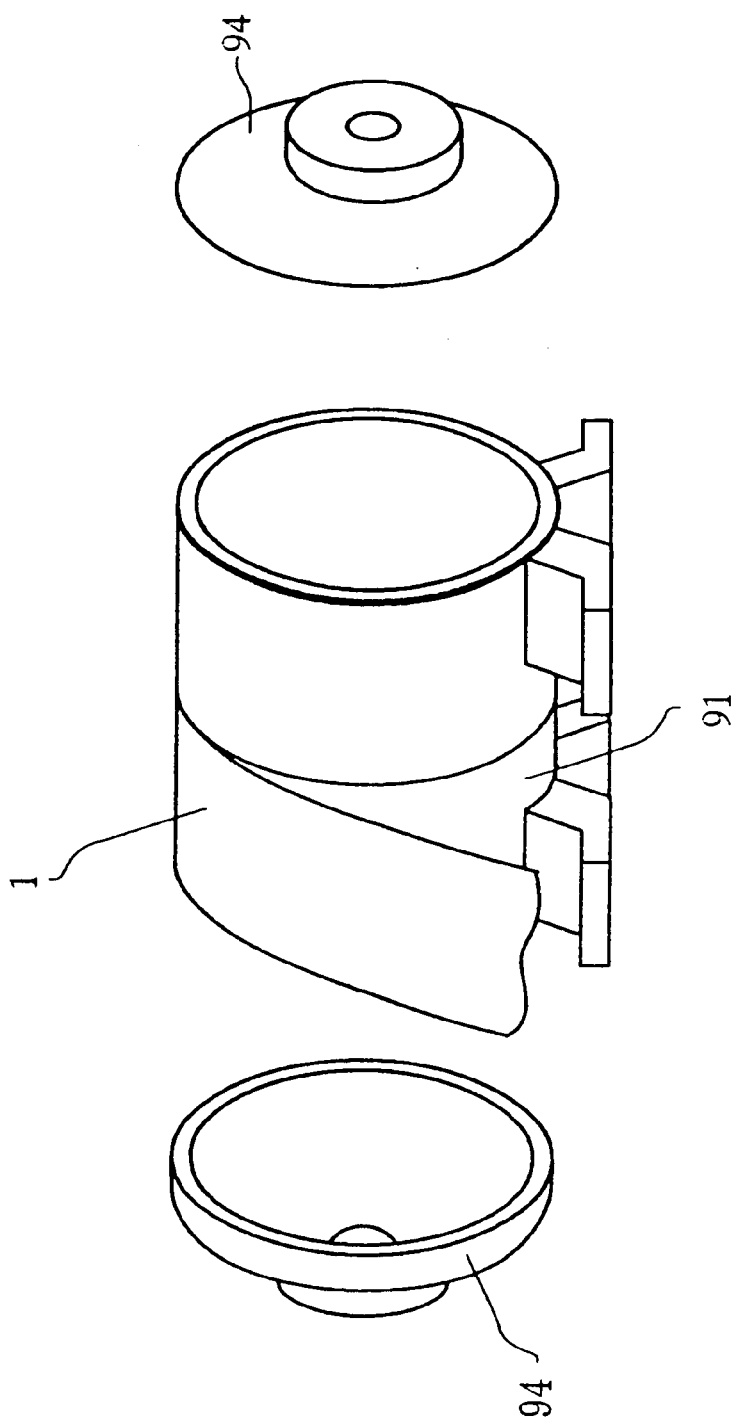

MAGNETIC SHIELD SHEET AND METHOD FOR MANUFACTURING THEREOF, AND CABLE USING THE SHEET

BACKGROUND OF THE INVENTION

1. Field of the Invention

The present invention relates to a magnetic shielding sheet, its manufacturing methods and uses. The sheet can be freely wound on electronic devices such as cables.

2. Description of the Related Art

Nowadays, a remarkable progress in intelligence and communication techniques and the use of computers, organization of network systems (to connect each computer with communication circuits) has been developing in a wide range of industrial fields. In the manufacturing field, many types of control devices, measuring equipment, and sensors are used accompanied by factory automatization through computers. But a problem arises due to leakage of magnetism into the surroundings from cables (such as those which supply electric current or which are used for communication), motors, magnetrons, and magnetic driving instruments. Leakage also occurs due to crosstalk between adjacent wiring boards, malfunctions in the electronic circuits in a computer. In order to prevent such a leakage of magnetism or to stop the effect of the leakage of magnetism, use of so-called magnetic shielding materials has become a common practice.

For such magnetic shielding materials, rolled plates made of permalloy or shaped members made by forging and pressing are used. These plates and shaped members are manufactured from plate materials by cutting, bending, and welding and they are used to shield rooms and spaces (where computers and other devices which contain electronic circuits are installed) from the effect of magnetism. To shield an electronic device having a particular size and shape, a number of receptacle forming members similar in form must be made by forging, pressing, and assembling.

But permalloy is expensive and requires extensive processing as described above and the shield materials from permalloy are also expensive. In addition the processing causes localized distortion which results in reduction of the magnetic shield characteristics. Moreover, the increase in weight and space for installation restricts the extent of application. It has been also extremely difficult to wrap or paste the shield material in the form of a plate on surfaces of various cables, in and outside electronic devices, or inside a computer room because of low flexibility in shape. Particularly, it has been almost impossible to put shields after laying cable, after assembling electronic device, or after completion of computer room construction.

An object of the present invention is to solve the conventional technical disadvantages described above and provide magnetic shielding sheets, manufacturing methods, and cables which include the shielding sheet. It is also an object of the invention to provide magnetic shielding sheets which are able to freely and easily cover on individual object, with no increase in weight and space, with a low manufacturing cost, regardless of the source of the occurrence, shape and size of the object, position of its installation, conditions, and the surrounding spatial situation.

SUMMARY OF THE INVENTION

The present invention is obtained by processing metal having a magnetic shield capability such as permalloy into a thin flexible lap sheet.

The magnetic shielding sheet relating to the present invention is made of alloys having a magnetic shield capability and is flexible having a thickness of less than 100 $\mu$m. The alloy includes soft magnetic metals such as Fe, Ni, and Cu as or alloys of Fe—Ni series, Fe—Cr—Al series, and Fe—Co—V series.

Among the alloys above described, Fe—Ni series having Ni content in the range of from 30% to 85 wt % are used. Such alloys may also have Mo in an amount which is less than 8 wt % and/or Cu in an amount which is less than 8 wt %.

The Fe—Ni series alloys described above include permalloy alloys such as PB permalloy (Fe-45% Ni), PC permalloy-1 (Fe-80% Ni-several percent of Mo), PC permalloy-2 (Fe-78% Ni-several percent of Mo- several percent of Cu), 12% Mn-9.6% Cu-6% Fe—Ni, PD permalloy (Fe-36% Ni) which is invar alloy having a low coefficient of expansion in nature, alloys of Fe-42% Ni, Fe-52% Ni, and alloys having these alloys as bases.

The reason of setting the content of Ni to be from 30 wt % to 85 wt % is that the shielding effect of the magnetism begins to lower from below 30 wt % while the effect disappears from above 85 wt %, just inviting an increase in cost.

And the reason of adding less than 8 wt % of Mo and/or Cu is to increase magnetic permeability, restrict magnetic anisotropy, and eliminate magnetostatics. From above 8 wt %, these effects are saturated.

In the Fe—Cr—Al series alloys, 10 wt % to 17 wt % of Cr is added to increase corrosion resistance and high frequency characteristic, and 0.01 wt % to 5.0 wt % Al is added to increase electrical resistance and high frequency characteristic. The reason of setting each upper limit to be 8 wt % is that the characteristics are saturated from the upper limit.

In the Fe—Co—V series alloys, 40 wt % to 60 wt % of Co is added to increase saturation magnetic flux density, and 0.1 wt % to 5 wt % of V is added to improve electrical resistance, high frequency characteristic, and easiness of processing. When the content exceeds the upper limit, the effects are saturated. This is the reason of the upper limit to be 5 wt %.

The magnetic shield sheets include the sheets coated with an adhesive layer on a part or all of a surface to ensure the shielding, though the shielding effect may be maintained even by only wrapping the sheet on the surface of an electrical insulating material such as a conductive cable. The sheet also includes a laminated sheet with plastic film or sheet, paper or corrugated card board for reinforcement or insulation at least on a surface for the protection of objects to be shielded while handling for transfer or shielding of magnetic recording media or after shielding.

Further, a cable having a sheath layer wound by the magnetic shield sheet on the periphery of electrical insulating layer around a communication cable is included.

The present invention also includes a method for manufacturing a flexible magnetic shielding sheet of less than 100 $\mu$m in thickness to obtain the magnetic shield sheet above described. The method consists of a process of repeated warm rolling and annealing, and a process of magnetic annealing, for a plane alloy plate having magnetic shielding capability. The plate or sheet which is processed to have a predetermined thickness by the warm rolling, embeds work strain and locked-in stress. These strain and stress are eliminated by annealing. Thus warm rolling and annealing are repeated several times till the thickness of the plate becomes less than 100 $\mu$m. Then magnetic annealing is applied at the designated temperature range to impart magnetic shield capability. The magnetic shielding sheet obtained is as flexible as foil so that it may be rolled up, for instance, on a reel.

BRIEF DESCRIPTION OF THE DRAWINGS

FIGS. 2A1–2A4 are diagrammatic views showing manufacturing process of the magnetic shield sheet of the present invention.

FIG. 4 is a graphical representation of relations between thickness of the sheet of the present invention and attenuation rates of the magnetic field;

FIGS. 10(A) to 10(H) are diagrammatic views showing figures putting the magnetic shielding sheet of the present invention on and into various electric devices and electrical products.

FIGS. 11(A) to 11(C) are a side elevational view, a sectional view, and a exploded perspective view of the magnetic shielding sheet of the present invention around a motor.

DETAILED DESCRIPTION OF THE PREFERRED EMBODIMENT(S)

The preferred embodiment of the present invention will be described as follows.

Figure 1A:
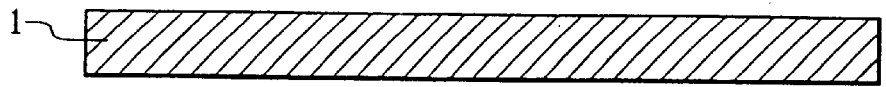
FIGS. 1(A) to FIG. 1(E) are each sectional views of magnetic shield sheets of the present invention.
Figure 1B:
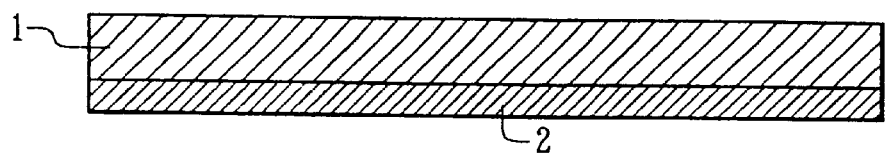

FIGS. 1 show cross sectional views of a magnetic shielding sheet relating to the present invention and FIG. 1(A) shows a cross sectional view of a shielding sheet 1 of PC permalloy-2 (for instance, Fe-78% Ni-3% Mo-3% Cu) having a thickness of 10 $\mu$m. The sheet 1 is extremely flexible and able to remain in contact with an object when the sheet is wound around a surface of an object to be shielded. It is possible to use a coated sheet having an organic adhesive layer 2 such as polyester adhesive on the whole or partial of one side of the surface as shown in FIG. 1(B) to ensure intimate contact with the object to be shielded.

Figure 1C:
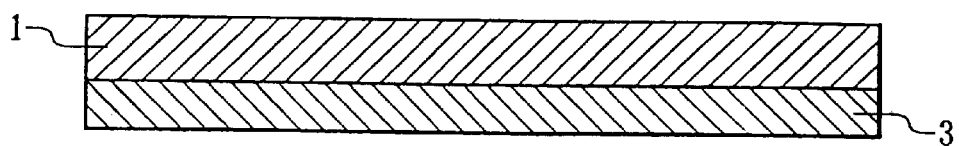
Figure 1D:
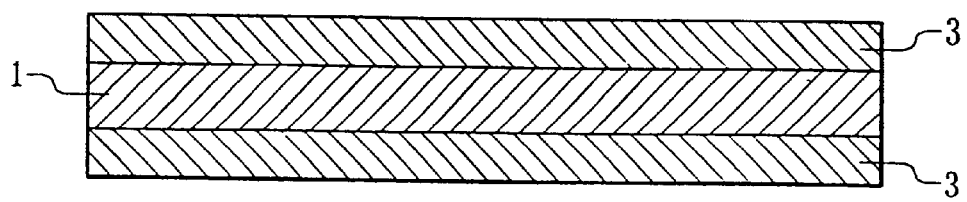

It is also possible to use the sheet 1 which includes a plastic film 3 adhered on a surface of the sheet as shown in FIG. 1(C) or plastic films 3, 3 on both surfaces of the sheet 1 as shown in FIG. 1(D) to reinforce the sheet 1 or to electrically insulate from a surface of the object to be shielded. In the latter case, material or thickness of the film 3 can be varied according to the object to be shielded.

Figure 1E:
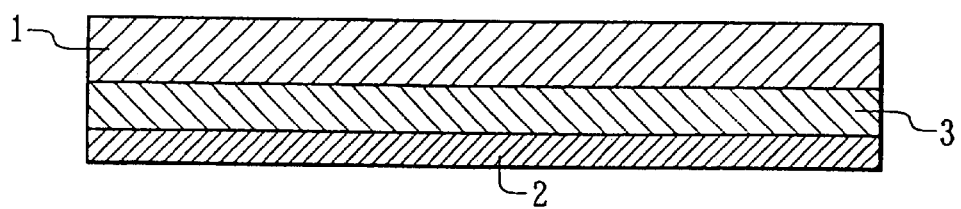

Incidentally, a sheet which is partially or entirely coated with an adhesive layer 2 on the outside surface of the film 3 attached on a surface of the sheet 1 as shown in FIG. 1(E), may be used.

Methods of manufacturing the magnetic shield sheet 1 will be explained here.

Figure 2:
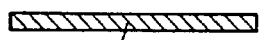
Figure 2:
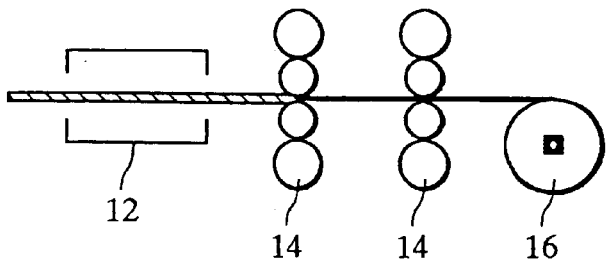
Figure 2:
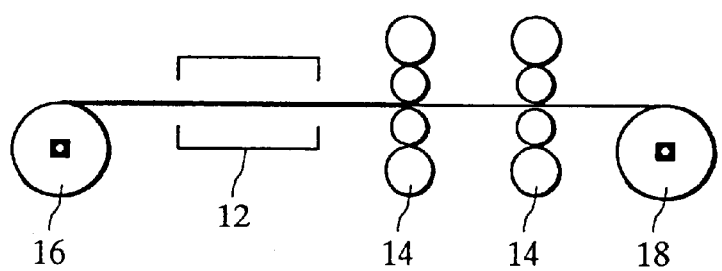
Figure 2:
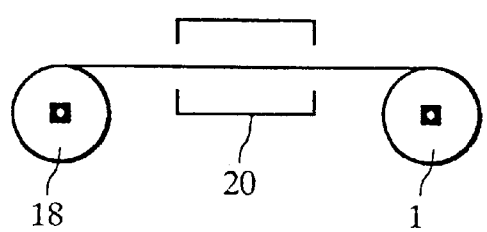

FIGS. 2(A1)–2(A4) show an outline of the manufacturing process to obtain the sheet 1. FIG. 2(A1) shows an elementary untreated plate 10 of 0.1 mm in thickness derived from PC permalloy-2 by cold rolling. The plate 10 is passed through an annealing furnace 12 at about 700° C. to 900° C. to eliminate internal strains and stresses as shown in FIG. 2(A2), and then immediately passed through a roll 14 for warm rolling at draft ratio 5% to 20% into a thin intermediate plate 16. The intermediate plate 16 is passed through the annealing furnace 12 and then immediately through the roll 14 to undergo warm rolling as shown in FIG. 2(A3). These warm rolling and annealing processes are repeated several times to obtain a thin sheet 18 of 1 to 100 $\mu$m thick. As shown in FIG. 2(A4) the sheet is kept in an annealing furnace 20 for 60 minutes at about 800° C. to 1000° C. for magnetic annealing to obtain the magnetic shielding sheet 1 having a stabilized magnetic characteristic. The lowest thickness of the sheet 1 is less than about 1 $\mu$m.

The magnetic shielding sheet 1 is also obtained from the Fe—Cr—Al series alloy and Fe—Co—V series alloy through the same manufacturing process as above described.

Figure 2B:
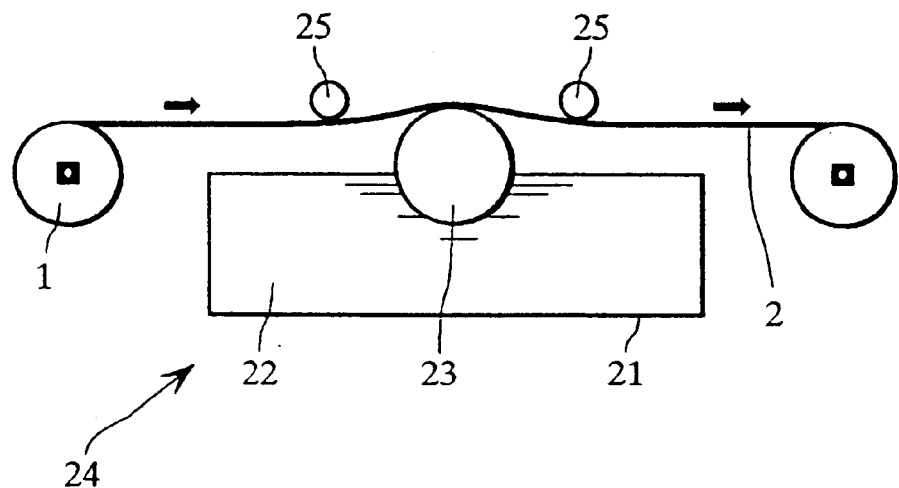
FIG. 2(B) is a diagrammatic view showing a process of providing an adhesive layer.

FIG. 2(B) shows a coating process for applying the adhesive layer 2 on one surface of the sheet 1. An adhesive coating apparatus 24 in which a rotatable roller 23 is fixed half immersed in the adhesive liquid at the upper central portion of the tank 21 filled with a stock adhesive solution 22, and a pair of hold down rollers 25, 25 are provided on the left and right above the roller 23, is used. The uppermost surface of the roller 23 is adjusted a little higher than the lowest surface between a pair of the hold down rollers 25. When the roller 23 is rotated clockwise and the sheet 1 is passed between the roller 23 and a pair of the hold down rollers 25 as shown in FIG. 2(B), the stock solution 22 of the adhesive is coated at a uniform thickness on a bottom surface of the sheet 1 through the surface of the rotating transfer roller 23. As an exposed surface of the adhesive layer 2 has anti-stick property, the sheet 1 can be wound into a reel, putting the adhesive layer 2 inside.

Figure 2C:
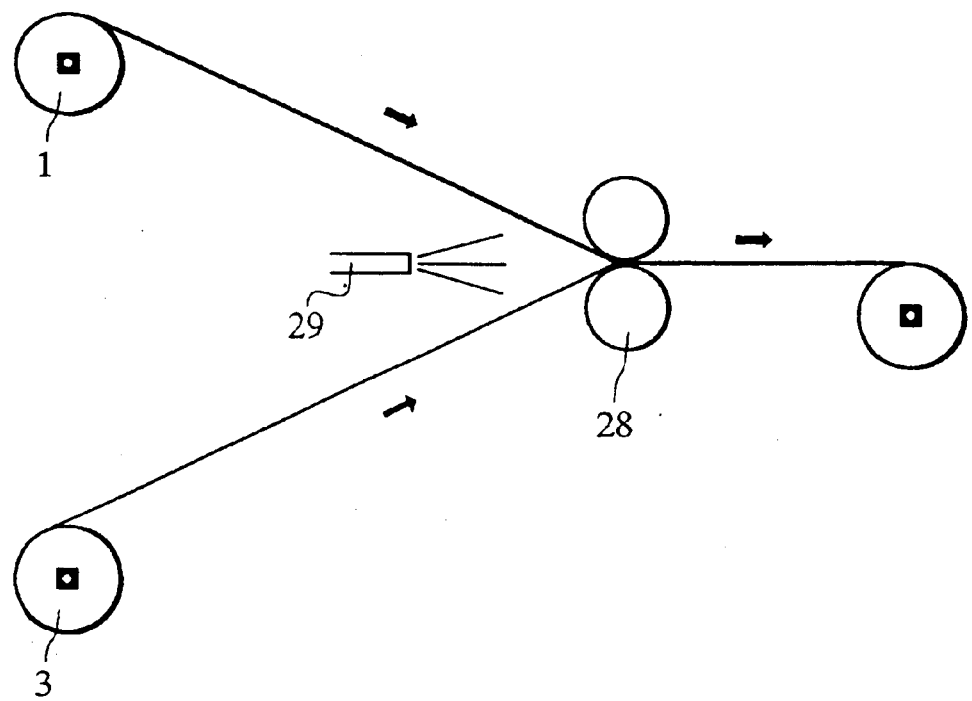
FIG. 2(C) is a diagrammatic view showing a process of bonding films together.

FIG. 2(C) shows a laminating process of the plastic film 3 on one surface of the sheet 1. A rewound sheet 1 from an upper roller and a rewound film 3 from a lower roller are passed through a pair of rollers 28 with pressure so that the sheet and film are laminated with each other. As an adhesive is precoated from a nozzle 29 on the inside surface of any one of the sheet 1 and the film 3 which are approaching each other, the sheet 1 attached with the film 3 can be continuously obtained. The film 3 can be replaced with a paper sheet in the laminating process.

Addition of the rewound film 3 and the nozzle 29 on the upper side of the sheet 1 in FIG. 2(C) makes it possible to laminate the film 3 on the both surface of the sheet 1 like the figure in FIG. 1(D). And when the sheet 1 attached with a film 3 which is obtained through the process shown in FIG. 2(C) is passed through the adhesive coating apparatus 24 in FIG. 2(B), placing the film 3 as a bottom surface layer, a laminated sheet 1 in which the adhesive layer 2 and the film 3 are laminated, as shown in FIG. 1(E) can be manufactured.

An experiment on the magnetic shielding sheet 1 of the present invention will be explained next.

Firstly, two kinds of shielding sheets 1 having thickness of 10 $\mu$m and 30 $\mu$m are prepared from rolled PC permalloy-2 (78% Ni-3% Mo-3% Cu—Fe). The sheets 1 are formed in a cylindrical shape (50 mm in diameter and 150 mm in length) by winding from one to five turns respectively, in which a pair of confronting helmholtz coils is inserted, and an AC current of 50 Hz is fed in both coils. Then, the cylinders are put into a magnetic field where 1 G (gauss) of magnetic field is applied from the surroundings, and attenuation rate of the magnetic field inside the cylinder is measured corresponding to the number of turns of the sheet with a gauss meter inserted in the sheet of the cylinder, respectively. The result is shown in a graph in FIG. 3.

Figure 3:
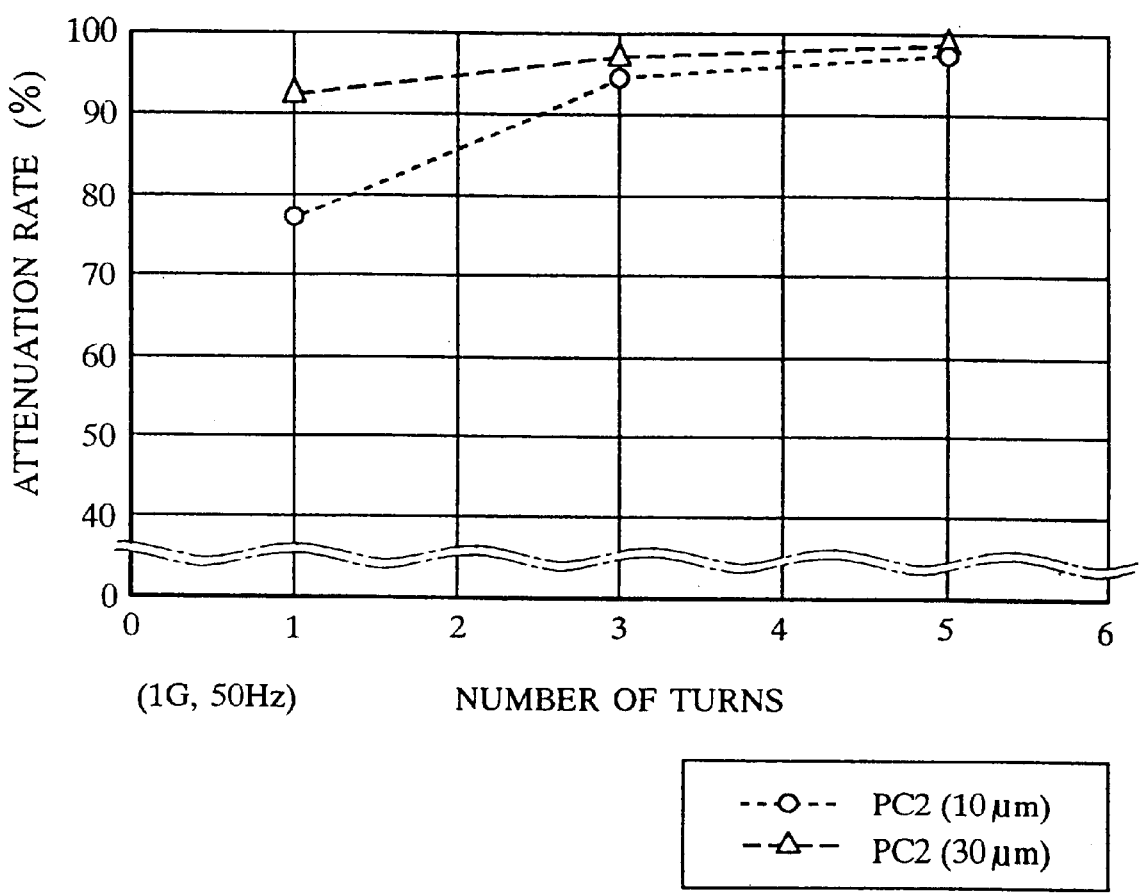
FIG. 3 is a graphical representation of relations between the number of turns of the sheet relating to the present invention and attenuation rates of a magnetic field.

From the result in FIG. 3, it is understood that more than 70% of the magnetism can be shielded by only one turn of both sheets. The sheet having a thickness of 10 $\mu$m shows improvement in shielding from the 70% level to the 90% level according to the increase of the number of turns, but the sheet of 30 $\mu$m in thickness shows only a little improvement around the 90% level even when the number of turns is increased. This is because a thin sheet of 10 $\mu$m thick is easily saturated with magnetic flux passing inside the sheet and leaks magnetism to inside the cylinder but when the number of turns is increased, the flux seems easily to pass through to the inside. On the contrary, as a thick sheet of 30 $\mu$m in thickness easily passes the magnetic flux through to the inside by nature, the leakage of magnetism seems to be little.

Figure 4:
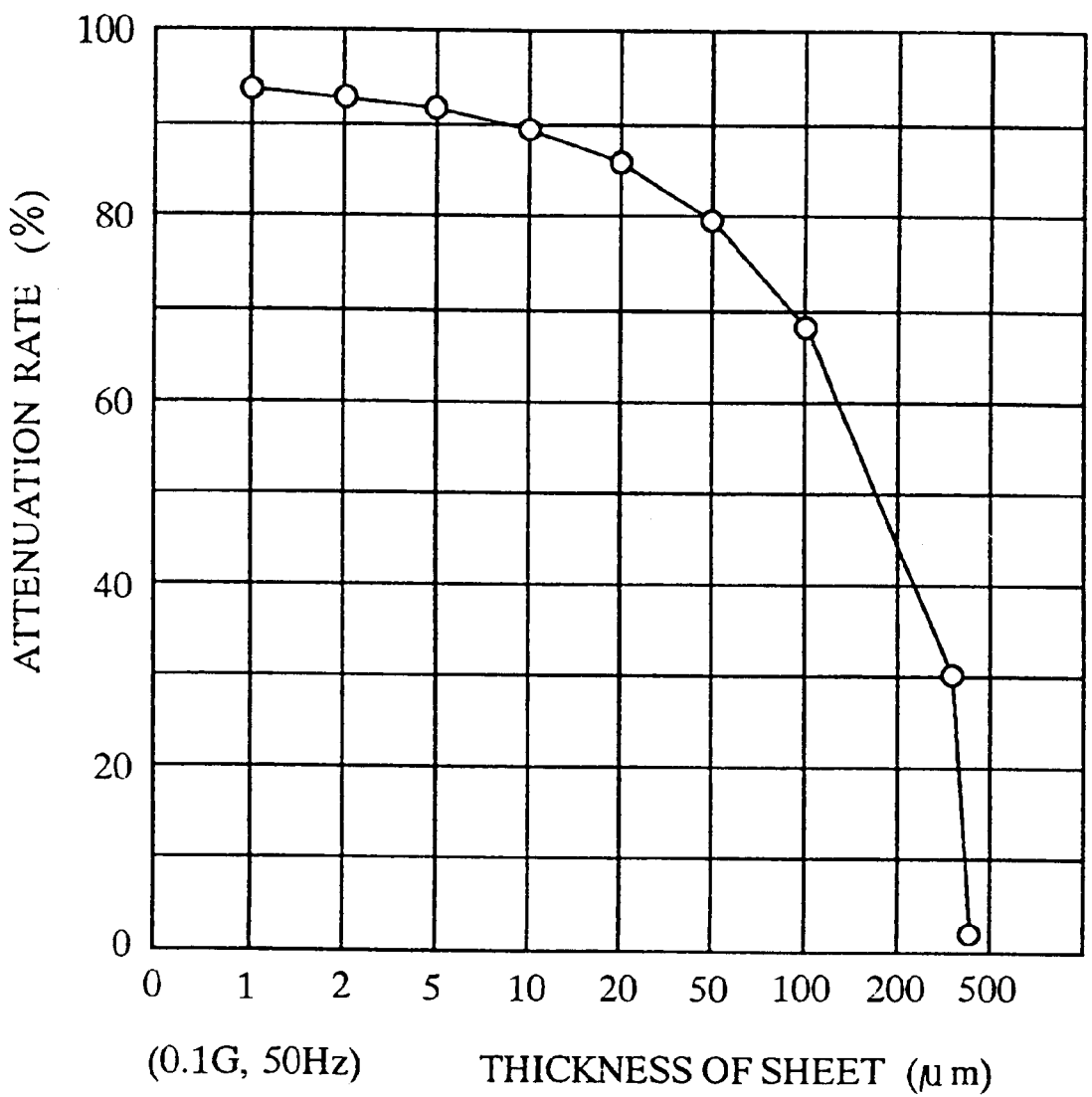

The sheets 1 having various thickness and yet having the same composition as that in the previous example are bent 5 times and put in a magnetic field of 50 Hz, 0.1 G. The attenuation rate of the magnetic field at each bent portion is measured in the same way as before. The result is shown in FIG. 4. It is seen that when the thickness of the sheet is less than 100 $\mu$m, the effect of the bending process to the attenuation rate is little, especially in the sheet of less than 5 $\mu$m thick, the bending process does not affect the attenuation rate. From these result, among the sheets 1 having a variety of thickness, a thinner sheet does not lower magnetic permeability and is not affected by the bending process.

A sheet made of the PC permalloy-2 and having a thickness of 30 $\mu$m is shaped into a cylinder by winding 5 turns in the same way as described above. This is put into an AC magnetic field of 50 Hz, and the attenuation rates of the magnetic field in the cylindrical sheet are measured with the gauss meter, while the strength of impressed magnetic field is changed by adjusting the electric current. The result is shown in FIG. 5.

Figure 5:
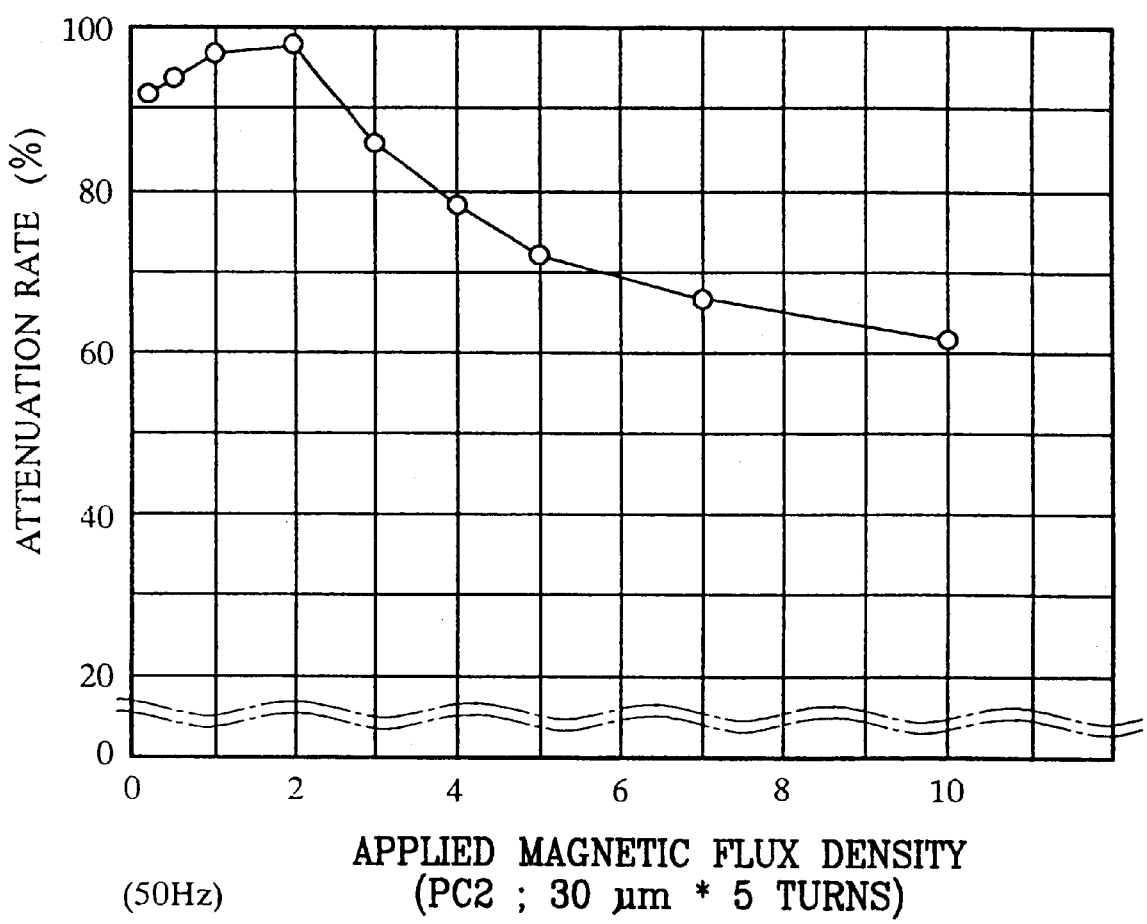
FIG. 5 is a graphical representation of relations between impressed magnetic field and attenuation rates of the magnetic field, using the magnetic shielding sheet of the present invention.

From the result in FIG. 5, it is understood that more than 90% of the magnetic shield is achieved in the impressed magnetic field of less than 2 G and more than 60% of the magnetic shield is achieved in a higher magnetic field.

From each result described above, it is understood that the magnetic shield sheet 1 of the present invention has a superior magnetic shielding capability at least in an AC magnetic field having a low frequency territory of about 50 Hz.

Figure 6A:
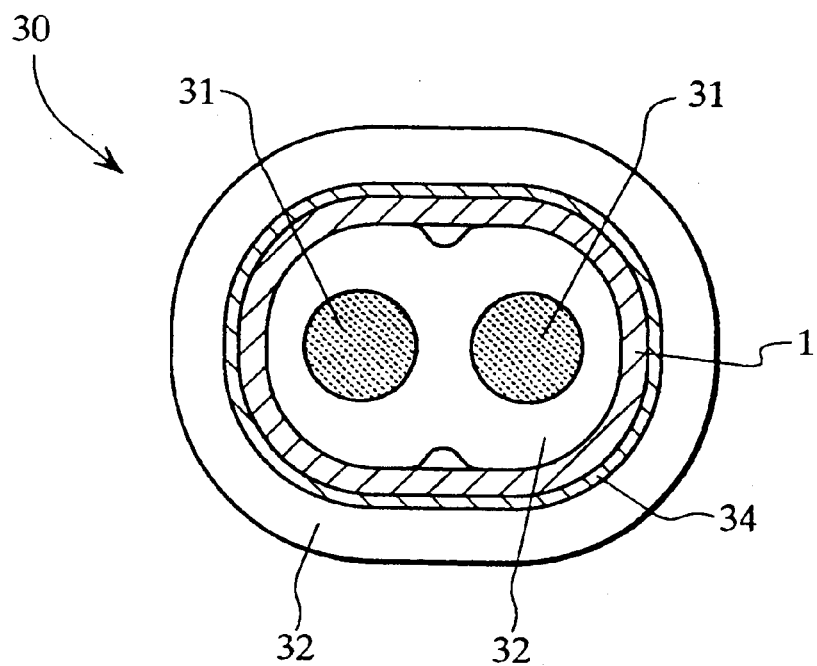
FIG. 6(A) is a cross sectional view of a cable having magnetic shielding capability relating to the present invention.

FIG. 6(A) shows a cross section of a communication cable 30 carrying a high frequency current.

Figure 6B:
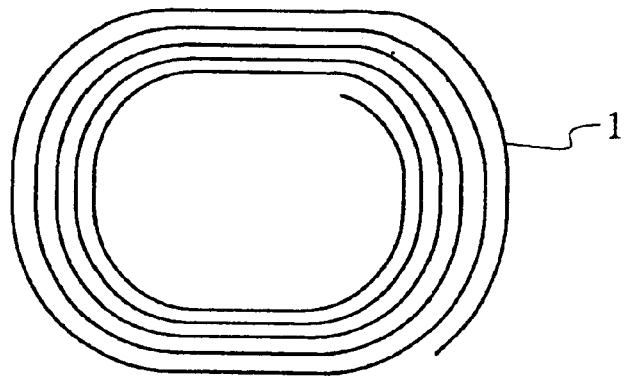
FIG. 6(B) is a diagrammatic view showing a form of the sheet used in FIG. 6(A)

The designation 31 in the figure is a communication line consisting from a pair of conductors, which is called "twist pair". A insulating layer 32 made of resin or rubber covers the conductors and a shielding layer of the magnetic shielding sheet 1 is surrounding the periphery of the insulating layer 32. The shielding layer is formed from a very thin sheet 1 of 1 to 3 $\mu$m in thickness, wound several turns, and bonded with an adhesive coated in advance on the sheet in 10 to 100 $\mu$m thick, which is shown in FIG. 6(B). Incidentally, the designation 34 in FIG. 6(A) is a copper foil layer for shielding a radio wave, and the insulating layer 32 are also wound around the outside in the same manner as before.

As for the cable 30, the sheet 1 of 3 $\mu$m thick, wound three turns is prepared. An electric current having the same direction (noise) with that of designated current is fed through the communication line 31 in the cable 30 and the attenuation rate of an outside magnetic field is measured by a gauss meter placed around the cable 30 while the frequency of the current is changed. The result is shown in a graph of FIG. 7. And the attenuation rate of same direction current(noise) is measured with a network analyzer on decreasing voltage between both ends of the cable 30. The result is shown in FIG. 8.

Figure 7:
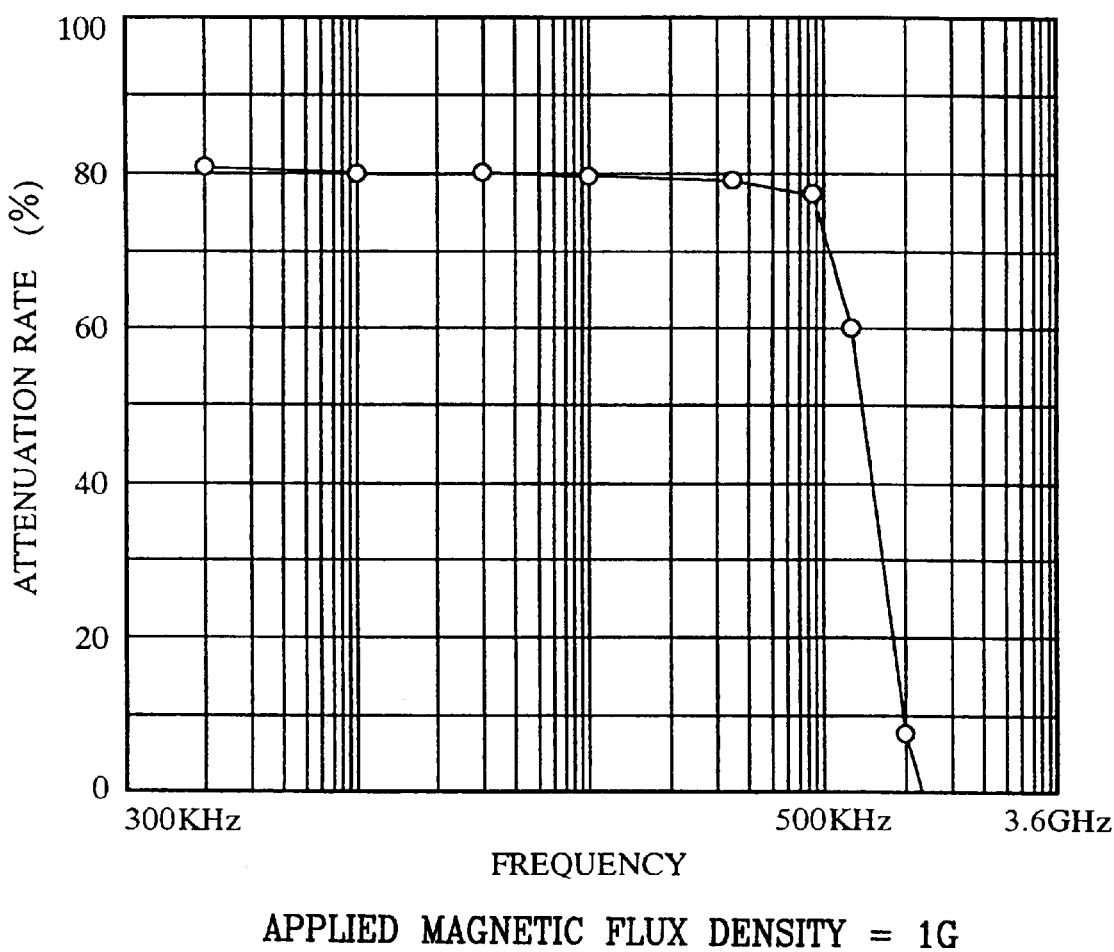
FIG. 7 is a graphical representation of relations between frequency and attenuation rates of the magnetic field, using a cable of the present invention.

From the result in FIG. 7, it is understood that about 70% of the magnetic field is shielded in less than 500 MHz and in a 100 MHz level high frequency territory which is used for communication, a sufficient magnetic shielding can be achieved. The above results show that it is now possible that in long distance communication with a high frequency wave, the effect of the magnetic field to the outside can be reduced, and the effect of noise can also be reduced by fully performing magnetic shielding from the outside.

Figure 8:
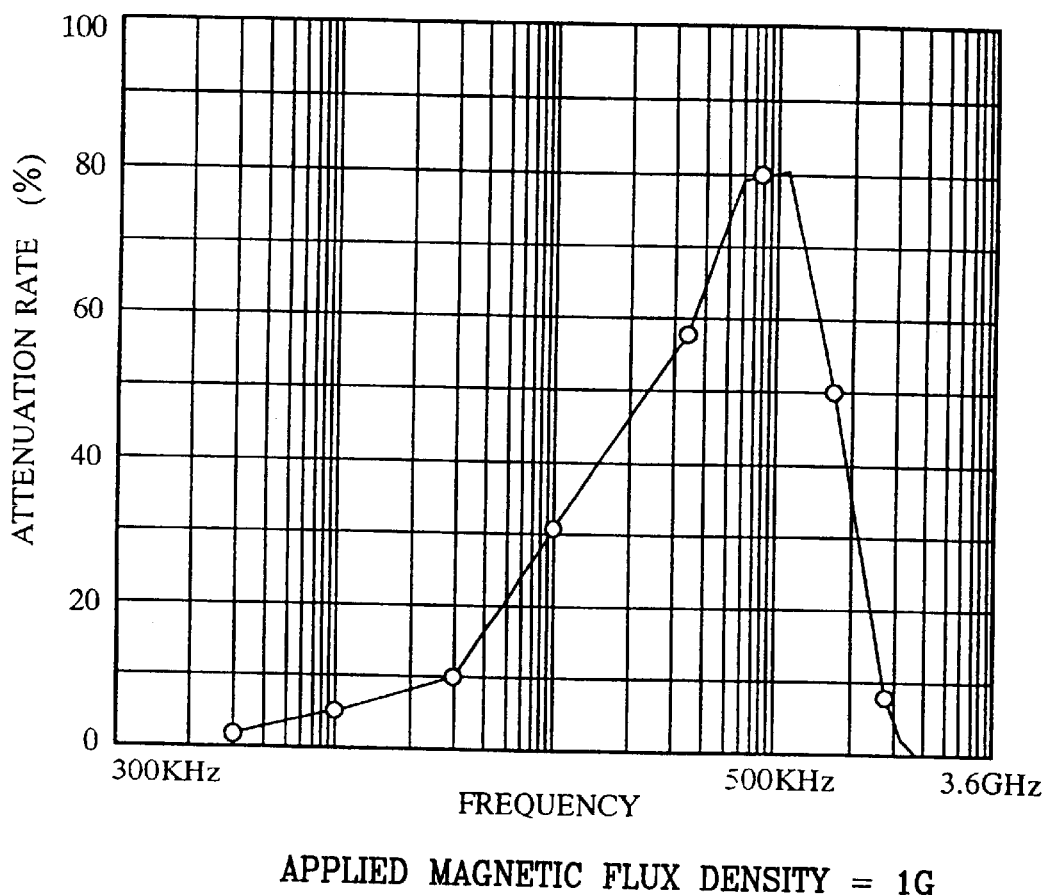
FIG. 8 is a graphical representation of relations between attenuation rates of the electric current and frequency when same direction current is applied in a cable of the present invention.

From the result in FIG. 8, it is found that a noise caused by a 100 MHz level same direction current is eliminated. The data from FIG. 8 confirms that the sheet is not easily affected by communication noise.

Furthermore, an embodiment of another cable using the magnetic shield sheet 1 of the present invention is explained.

Figure 9:
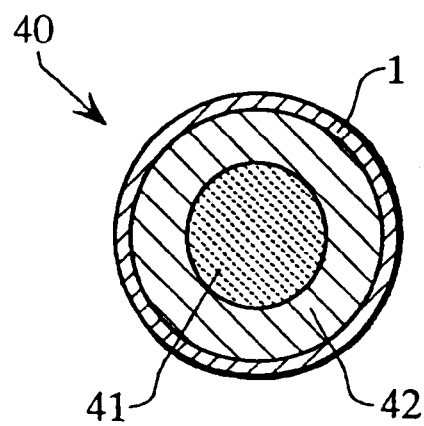
FIGS. 9(A) to 9(F) are sectional views and a perspective view of conductive cables wound with the magnetic shielding sheet of the present invention.
Figure 9:
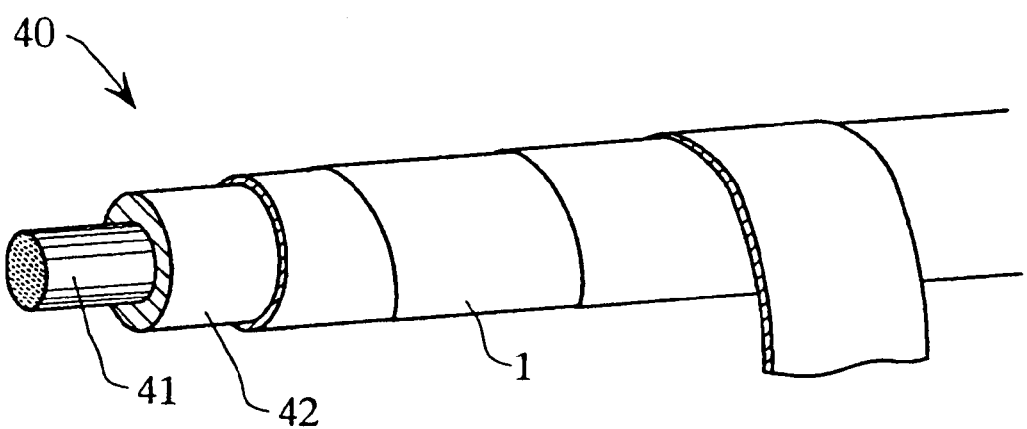
Figure 9C:
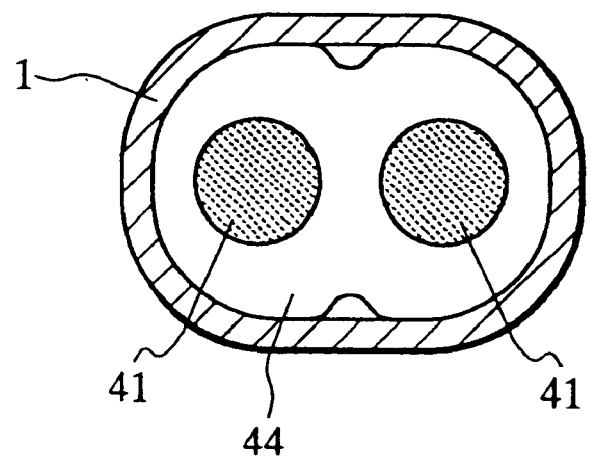
Figure 9D:
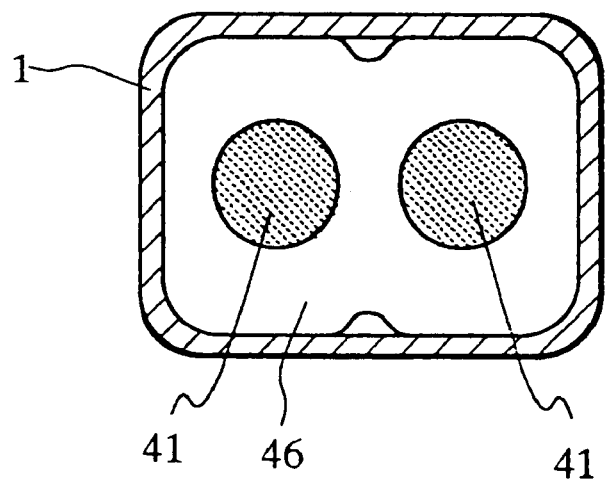
Figure 9:
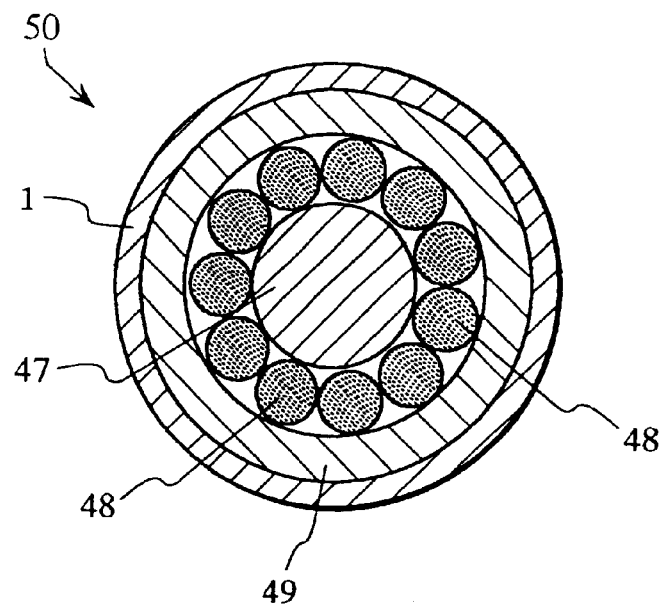
Figure 9:
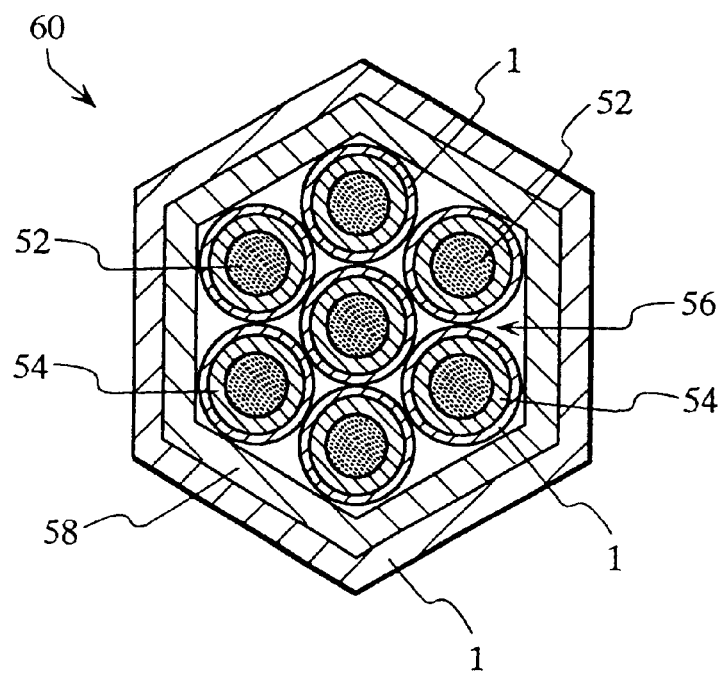

FIGS. 9A–9F show figures of the shielding sheet wound around various cables. FIG. 9(A) is a cross sectional view of the magnetic shielding sheet 1 wrapped around the surface of a conductive cable 40 which consists of a bundle of conductive wires 41 and an insulating layer 42 such as polyvinyl chloride sheet covering around the wires, and FIG. 9(B) is a perspective view of the conductive cable 40 wrapped with the magnetic shielding sheet 1 on the surface. The edges of adjacent sheets 1, 1 are overlapping each other. FIG. 9(C) and FIG. 9(D) show cross sectional views of wound magnetic shielding sheet 1 on the surface of a round vinyl cord 44 for(C) and a flat vinyl cord 46 for (D) respectively. For the magnetic shielding sheet 1, only a metal sheet 1 may be wound on a requested portion for home use, but a sheet 1 coated with the adhesive layer 2 to prevent coming unstuck, or a sheet 1 laminated with the plastic film 3 for reinforcement or insulation, may be used. Or only around the neighbor of such as a personal computer, the sheet 1 can be wound several turns to ensure the prevention of the leakage of the magnetic field.

FIG. 9(E) shows a cross sectional view of a high tension wire 50 wound with the magnetic shielding sheet 1 on the outer surface. The high tension wire 50 has a structure wherein a low expansion alloy such as invar alloy (36 Ni—Fe) is used as a core material 47, on the surface of which stranded wires 48, made of aluminum alloys or copper surround the core and the above structure is wrapped with an insulating layer 49. On the surface of the insulating layer 49 the sheet 1 having the adhesive layer 2 on the inside is wound. By using a thick sheet 1 or winding a thin sheet 1 several turns to make thicker, the leakage of the magnetic field occurring in the surroundings by a large current in the stranded wires 48 can be prevented or reduced with reliability.

FIG. 9(F) shows a cross sectional view of a combined cable 60 wound with the magnetic shield sheet 1 on the outer surface. Around each surface of the conductive cables 56, consisting of lead wire bundles 52 covered with insulating layers 54, the shielding sheet 1 having the adhesive layer 2 on the inside, is wound. And also around the surface of an insulating cover 58 which covers the bundle of whole cables 56, the shielding sheet 1 having the plastic film 3 on the outside, is wound. Thus, it becomes possible that the mutual effect caused by the magnetic field is suppressed by shielding each cable 56 with the sheet 1, and the leakage of the magnetic field from the bundle of whole cables 56 to the outside is prevented with reliability.

When the surface of a fiber-optic cable is wound with the magnetic shield sheet 1, (not shown), the effect of the outside magnetic field can be stopped and communication waves can be sent with reliability.

FIGS. 10A–10J show the magnetic shielding sheet 1 on electrical appliances and electrical products.

Figure 10A:
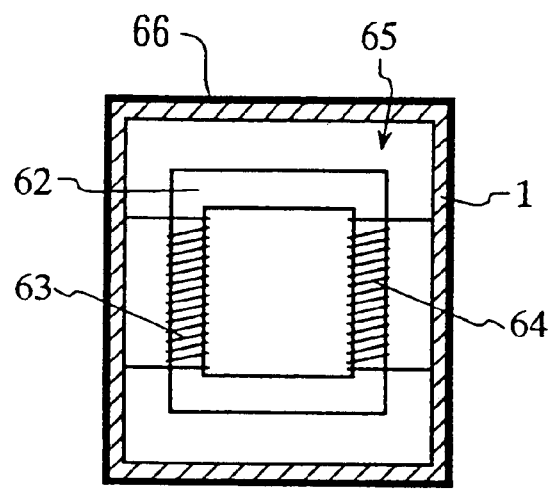

FIG. 10(A) shows a cross sectional view of the sheet 1 having an adhesive layer 2 coated on the outside, sticking on the inside surface of a box 66 in which a transformer having the primary and the secondary coils opposedly winding around an iron-core is placed. The lined sheet 1 prevents or reduces to leak the magnetic field from the transformer 65 to the outside.

Figure 10B:
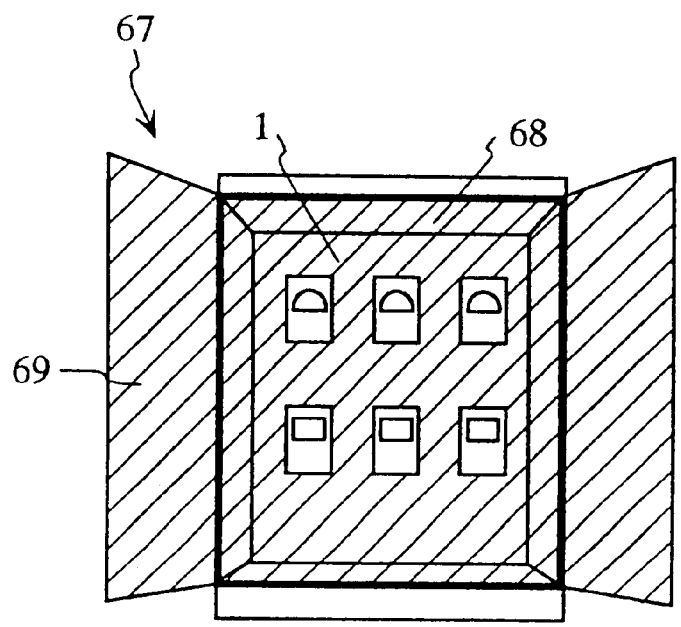

FIG. 10(B) shows a front view of a box 68 or its door 69 of a switch board or a control board 67 having various kinds of meters, recorders, or switches in the inside, which the sheet 1 is stuck inside. The sheet 1 prevents or reduces the effect of the outside magnetic field on the meters and others.

FIG. 10(C) shows a cross sectional view of an AC adapter 70 to convert alternating current to direct current. The magnetic shielding sheet 1 is wound only around a transformer 72 for transformation, which is placed inside with condensers and diodes 71.

FIG. 10(D) and FIG. 10(E) show a front view and a cross sectional views of the side elevation of a TV box 74. The sheet 1 is stuck on the surfaces inside the box 74 except the surface standing in front of a cathode-ray tube 75 arranged in the TV 73. The sheet 1 in the box 74 reduces the magnetic field leaking from the TV 73 to the surroundings.

Figure 10F:
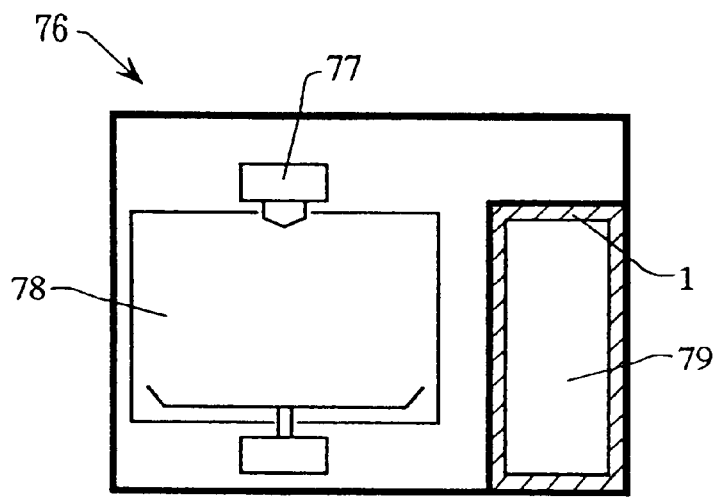

FIG. 10(F) is a cross sectional view of a microwave oven 76. The sheet 1 is stuck on the inside surfaces of a control room 79 having various kinds of switches, which is adjacent to a colding room 78 having a magnetron 77 in the upper portion. The switches, indicators or the like in the control room 79 can be protected from the powerful magnetic field induced from the magnetron 77 arranged in the same microwave oven 76 with the make up.

Figure 10G:
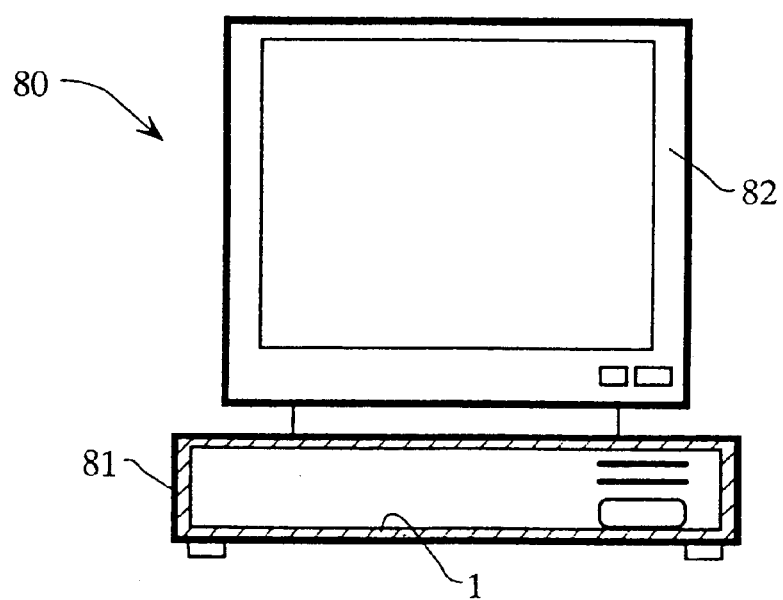

FIG. 10(G) shows a cross sectional view of a main body 81 of a personal computer 80, inside which the sheet 1 is stuck. A hard disk or recording elements and the like in an electronic circuit in the main body 81 are protected from the magnetic field from a display 82 embedding a cathode-ray tube in the upper portion or from the outside.

Figure 10H:
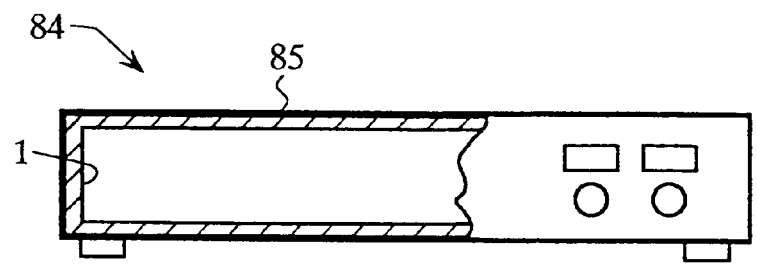

FIG. 10(H) is a partial cross sectional view of a box 85 for a videotape recorder, a laser-disc recorder, or a compact-disc player 84, inside the surface of which the sheet 1 is stuck to protect the recording media of each instrument described above from the magnetic field from the outside.

Figure 10I:
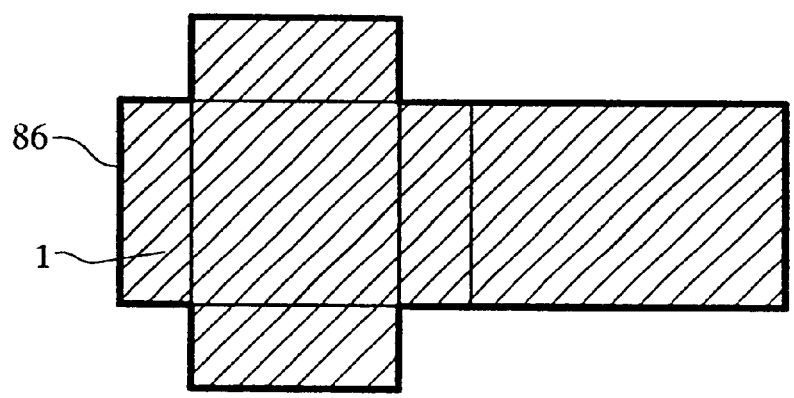
FIG. 10(I) is an expanded view of a metal plate for a box, which is affixed with the magnetic shielding sheet

In each of the electric products, the sticking of the sheet 1 inside surface of the box can be easily performed by sticking in advance the sheet 1 cut in a designated shape and size, which is coated with the adhesive layer 2 on one side, to the inner surface of a metal plate 86 to be bent and built into the box as shown in FIG. 10(I). Besides, as the lining with the sheet 1 does little affect the size of the inner space, there is no harm in fixing up the inner parts. Incidentally, for a plastic front panel having a complicated shape, a custom-built sheet 1 is used.

Figure 10J:
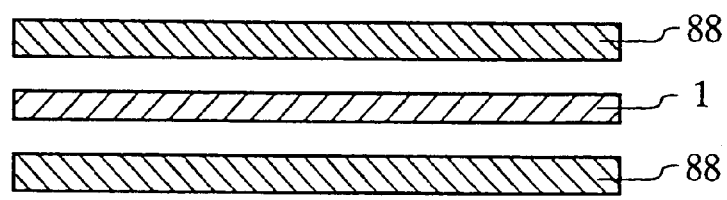
FIG. 10(J) is a cross sectional view showing that the magnetic shielding sheet is placed between circuit boards.

FIG. 10(J) shows an example that the sheet 1 inserted between two IC wiring boards 88 placing each other in parallel to prevent the cross-talk between the two boards.

FIGS. 11A–11D show the magnetic shielding sheet 1 adhered around a driving source such as a motor.

Figure 11A:
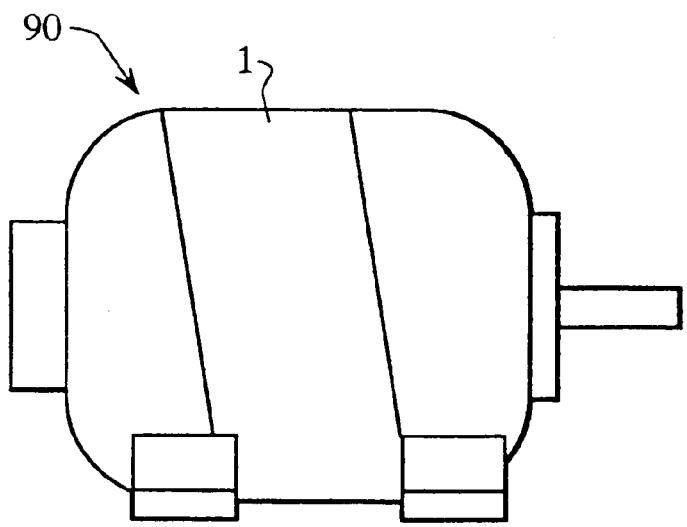
Figure 11B:
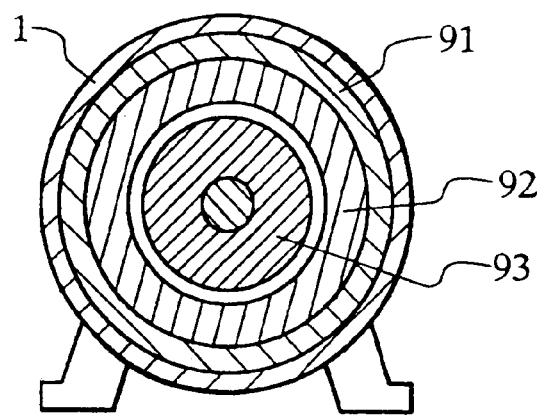

FIG. 11(A) is a side elevational view of the sheet 1 stuck around the surface of, for instance, an induction AC motor 90. The motor 90 has a configuration shown as a cross sectional view in FIG. 11(B) that a stator 92 is closely positioned into the case 91 and a rotor 93 having a rotating shaft is arranged in the stator 92 with a little space. Therefore the sheet 1 cannot be stuck inside the case 91. Then, as shown in FIG. 11(C), the sheet 1 is stuck on the surfaces of the case 91 and both side brackets 94, 94 with the adhesive layer 2.

In such a case, as apertures are arranged in the brackets 94 to connect through from inside to outside of the motor 90, the sheet 1 is not stuck on the apertures or small holes or slits are made on the spots of the sheet 1 covering the apertures so that the leakage of the magnetic field from the motor 90 can be reduced while maintaining the functions.

Figure 11D:
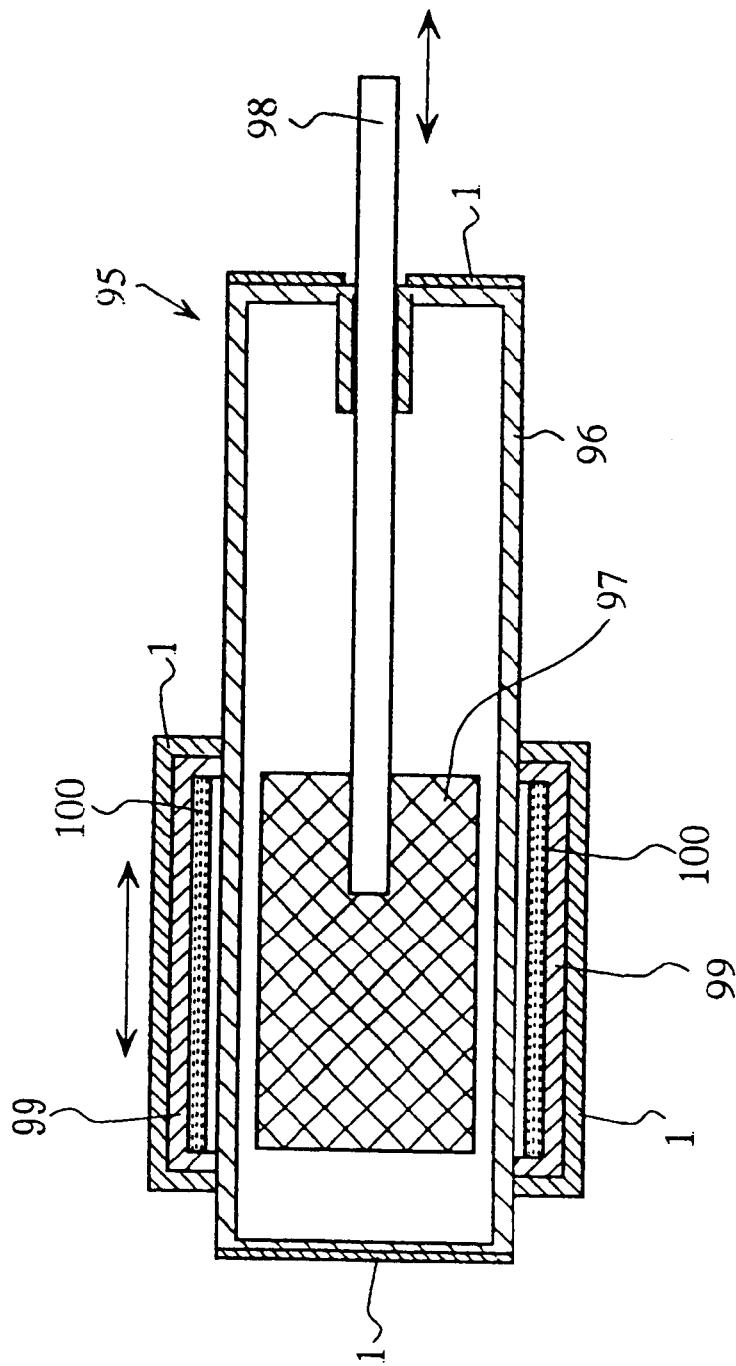
FIG. 11(D) is a cross sectional view of a magnetic actuator.

FIG. 11(D) shows a cross sectional view of a magnetic actuator 95. A permanent magnet 97 having, for instant, a cylindrical shape, and a rod 98 which is fixed to the magnet 97 at an end of the rod 98, are arranged in a slidable and rotatable manner inside a non-magnetic inner cylinder 96. Outside the inner cylinder 96, a short ring shaped outer cylinder 99 is fitted in a slidable and rotatable manner. When the outer cylinder 99 which fixes a permanent magnet 100 in the inside is slid, the magnet 97 in the inner cylinder 96 follows to the movement of the permanent magnet 100 which attracts the magnet 97. Then the rod 98 can reciprocate or rotate and is able to control an operating means attached at the tip end of the rod (not shown). By winding or sticking the magnetic shielding sheet 1 around the outside surface of the outer cylinder 99 or both side surfaces of the inner cylinder 96, effects of the magnetic field from the magnets 97 and 100 can be reduced. As a matter of course, loose covering the whole outside of the actuator except the rod 98 with the sheet 1 so that the operation of the outer cylinder 99 should not be disturbed, reduces the effect of the magnetic field.

FIGS. 12A–12D show a magnetic shield room 101 using the magnetic shield sheet 1.

Figure 12A:
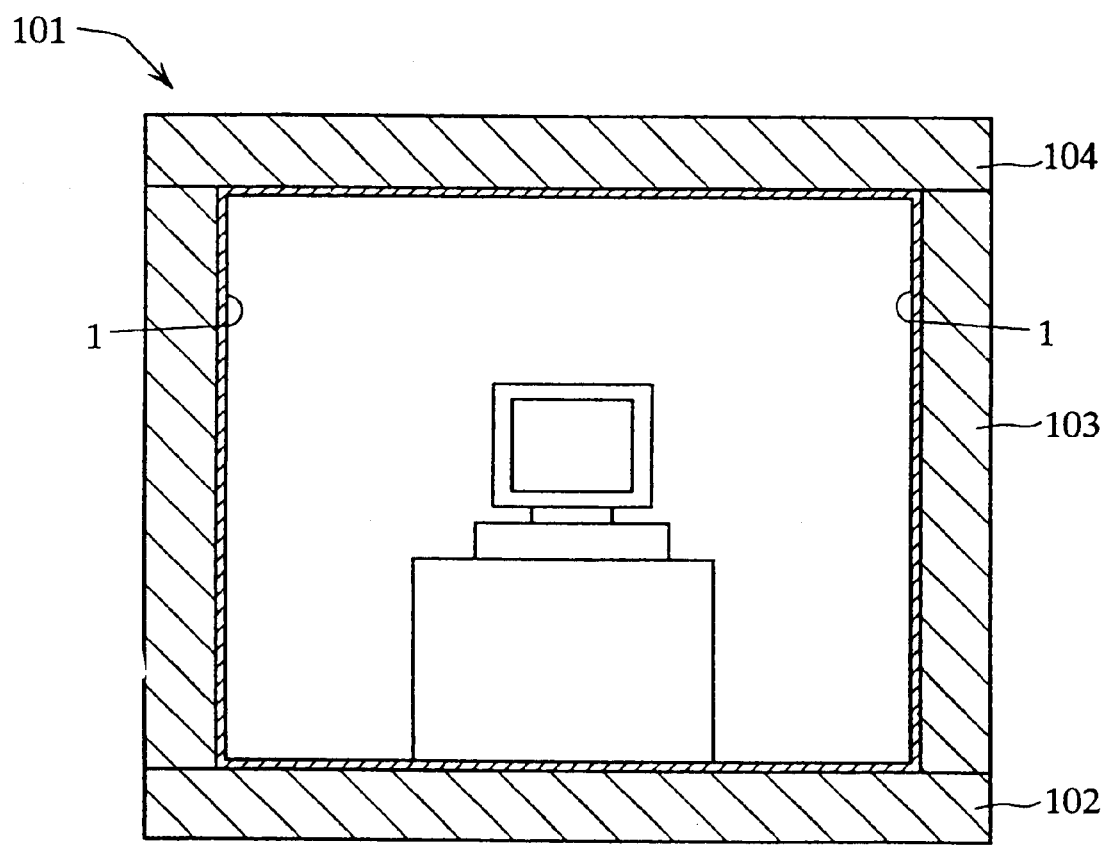
FIGS. 12(A) to 12(C) are a horizontal sectional view and a partial sectional view of a shield room in which the magnetic shield sheet relating to the present invention is affixed and FIG. 12(D) is a diagrammatic view showing a usage of the sheet.
Figure 12B:
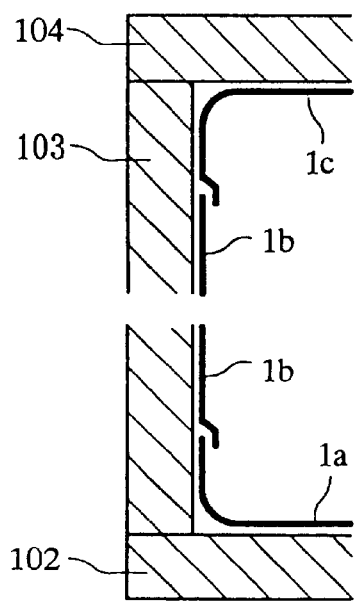

FIG. 12(A) shows a vertical cross section of the shield room 101 where various kinds of precision measurement instruments, computers and so on are installed. The shield room 101 is consisted of, for instance, a floor panel 102, a wall panel 103 and a ceiling panel 104, and the magnetic shielding sheet 1 is stuck on side surfaces of the room without any space by using the adhesive layer 2. FIG. 12(B) is a figure of the sheet 1 stuck on the corner of a wall panel and a floor panel, a wall panel and a ceiling panel. First, a upper end portion of a sheet 1a which is stuck on the floor panel 102 is lifted toward along the wall panel 103 and positioned over a bottom end portion of another sheet 1b which is stuck on the wall panel 103, thus the two sheets are overlapped at each end portion. Then, a bottom end portion of still another sheet 1c which is stuck on a ceiling panel 104 is positioned under the upper end portion of the sheet 1b and overlapped with each other. The way of lining inside described above can continuously shield inside the room with the sheet 1 and each overlapped portion of the sheet 1 helps to protect accidental peeling off of the sheet 1, which can be listed as a merit.

Figure 12C:
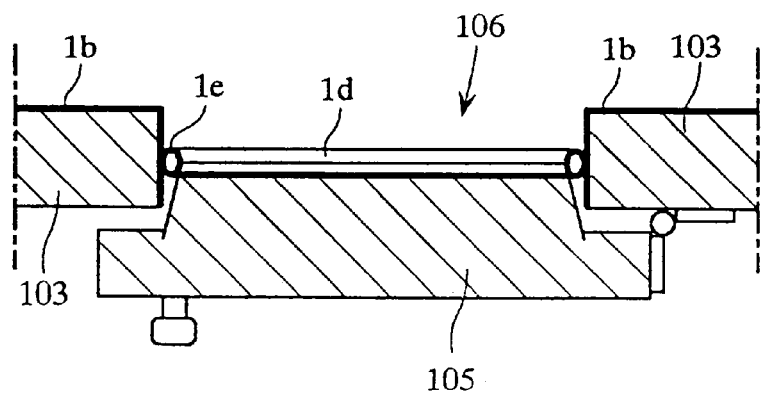
Figure 12D:
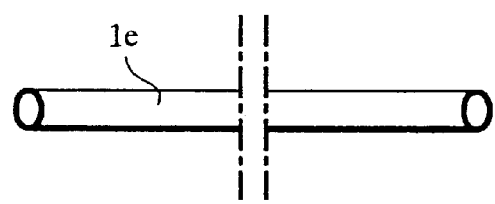

As to a door 105 of the shield room 101, as shown in FIG. 12(C), it is necessary to make a continuous shielding with each other between each sheet 1b stuck on both wall panels 103, 103 forming a doorway 106 and a sheet 1d stuck on the inside surface of the door 105. For this purpose, as shown in FIG. 12(D), a sheet belt 1e which is rolled with the sheet 1 into a cylinder having a circular or elliptic cross section is vertically fitted around the whole surroundings of the sheet 1d which is stuck on the inside surface of the door 105 so that both side ends of the sheet belt 1e along the direction of the length touch each sheet 1b on the wall panels 103, as shown in FIG. 12(C). Similarly, by adjusting both tips at top end and bottom end of the sheet belt 1e to touch to ends of the sheets 1a and 1c which are stuck on the floor panel 102 and the ceiling panel 104, the inside of the shield room 101 can be covered with the sheet 1 and shielded from the outside magnetic field.

A package using the magnetic shield sheet 1 of the present invention will be explained next.

Figure 13A:
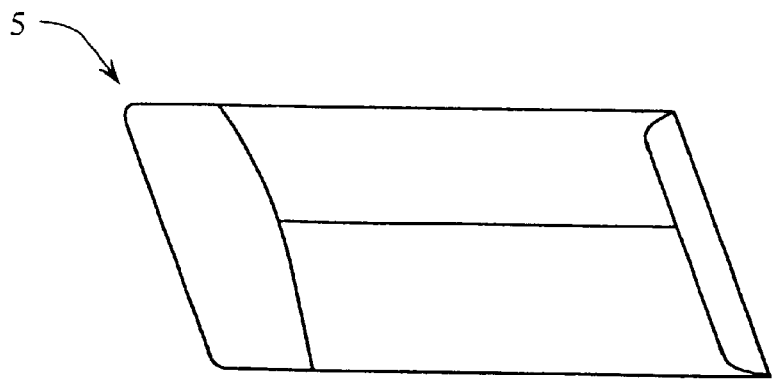
FIG. 13(A) is a perspective view of an envelope using the magnetic shielding sheet of the present invention.
Figure 13B:
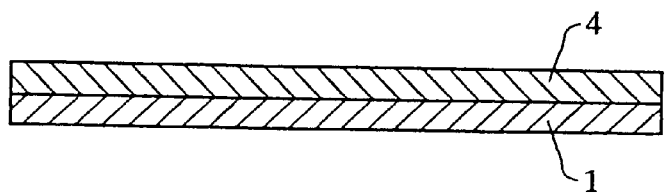
FIGS. 13(B) to 13(D) are cross sectional views of the magnetic shield sheets to use for the envelope.
Figure 13C:
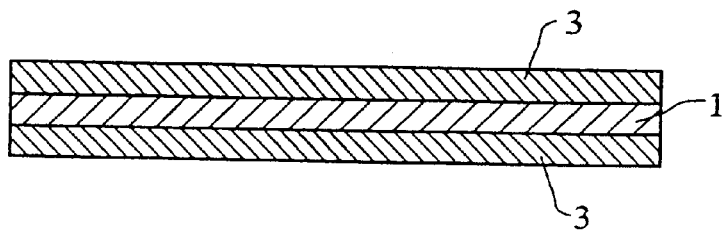
Figure 13D:
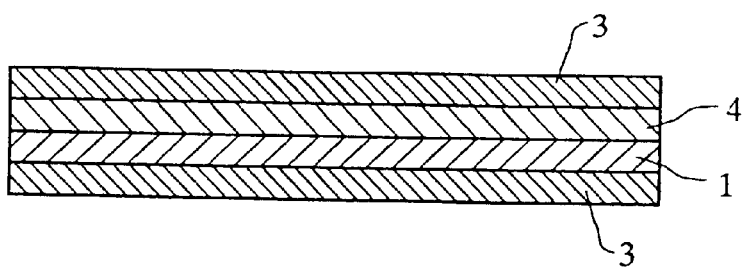

FIG. 13(A) shows an envelope or a bag 5 to package a floppy disk (FD) and the like. A cross section of a composite sheet which forms the main body of the envelope 5 is the magnetic shielding sheet 1 and a paper 4 bonded on the outside surface of the sheet 1 as shown in FIG. 13(B), the sheet 1 bonded with plastic film 3 on both sides of the sheet 1 as shown in FIG. 13(C), or the sheet 1 bonded with paper 4 on the outside surface of the sheet 1 and further bonded with films 3, 3 on both surfaces of the paper bonded sheet as shown in FIG. 13(D). Thus, the composite sheet is in general consisted of the sheet 1 as a base and laminated with paper 4 or film 3.

By carrying or storing magnetic recording media and the like such as a ID, a CD (compact disc), or a MD (mini disc) in the envelope 5 or the like, effects of the outside magnetic field can be prevented. Besides, the sheet 1 is thin and flexible, so it is easy to make and use as a packaging material such as an envelope or a bag, which is also a merit of the present invention. And by replacing the paper 4 to a corrugated cardboard or a plastic plate, it can be changed into another package material such as a cubic or a rectangular parallelepiped shaped packaging box or container.

Figure 13E:
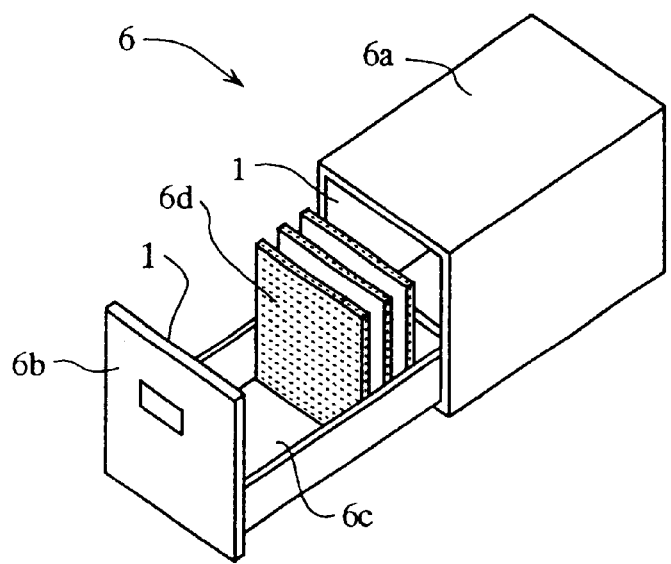
FIG. 13(E) is a perspective view of a cabinet.

FIG. 13(E) shows a cabinet 6 for storing magnetic recording media such as FD, CD, MD, and electronic photographs, on which inner surfaces of a box 6a and a door panel 6b are stuck with the magnetic shield sheet 1. When floppy discs and the like 6d are put in the drawer 6c and the drawer 6c is shut, the floppy discs are surrounded by the sheet 1 and protected from the effect of the outside magnetic field.

Figure 13F:
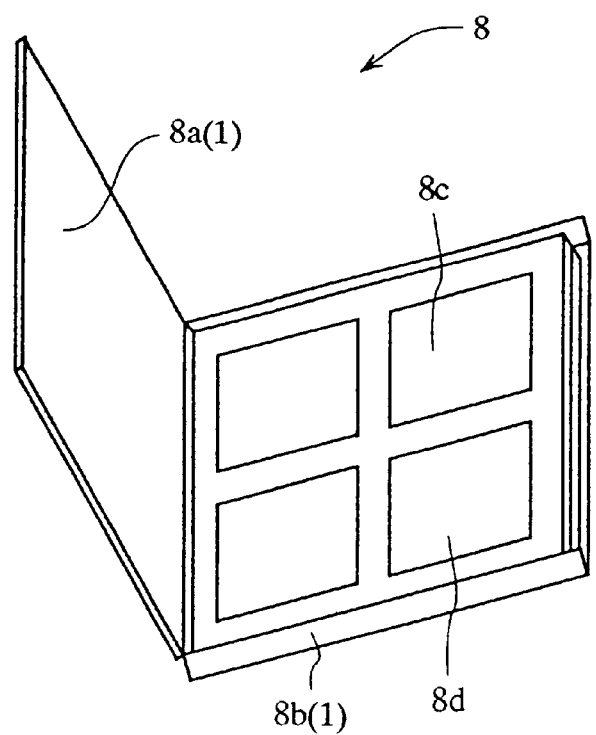
FIG. 13(F) is a perspective view of a file.

FIG. 13(F) shows a file 8 composed of the composite sheet for storing FD and the like, which is stuck with the magnetic shield sheet 1 on the inner surfaces of the front cover 8a and the box shaped main body 8b. In the file, a holder 8c for storing several numbers of FD and the like 8d is held. And when the front cover 8a is closed, the outside magnetic field is blocked.

The present invention is not limited to the above described embodiments.

(The magnetic shielding sheet 1 includes not only a thin sheet made from an alloy of Fe—Ni series, Fe—Cr—Al series or Fe—Co—V series but also clad materials composed of thin sheets of plural different Ni—Fe alloys and the like in accordance with the nature of the magnetic field. And providing various coloring, patterns, or marks on the film or paper can make shielding objects easy to use or the interior environment comfortable.

Furthermore, in such a case that a film having a lightproof capability to eliminate ultra violet rays is used as the above described film, the light fastness can be improved when such film is used for winding around outdoor cables.

The magnetic shielding sheet can be used to wind around or stick on a portion or in a place or its neighbor where a large current passes or discharged, such as conductive cables for an industrial electric furnace, an arc furnace, an electric resistance furnace; a main power unit of a welder; an engine room of a motor vehicle, especially the neighborhood of sparks; a reactor of an electric train; or a control unit of a NC lathe.

The magnetic shielding sheet can be covered on the surface of a motor for a home-use refrigerator, washing machine, cleaner, electric fan, air conditioner; the neighborhood of a thermostat for an electric heater and the like; or the inside or the surface of a cellular phone. The magnetic shielding sheet is also laminated on a holder of a cellular phone.

In addition to these, the magnetic shielding sheet can be stuck using with the adhesive layer on the interior surfaces or on the window glass of a computer room or a clean room.

The present invention consists of a magnetic shielding sheet which is made of alloys having a magnetic shielding capability, flexibility and thickness of less than 100 $\mu$m, as explained above, so the sheet can be easily wound, stuck and affixed in accordance with the surface of the object to be shielded. And in accordance with the degree of intensity, or frequency of the magnetic field, the magnetic shielding sheet can be adjusted in thickness or by changing into a multiple layer. Besides, the weight or the surface area of the object to be shielded is little increased even when the adhesive layer, film or paper is used with the sheet, so the basic functions of the object are not harmed. The manufacturing processes of the present invention for preparing the magnetic shielding sheet consist of only rolling steps and annealing steps, and the laminating of adhesive layer, film, or paper can be continuously carried out. Therefore the magnetic shielding sheet can be economically produced through mass production.

Further, by using the cables of the present invention, leakage of the magnetic field to the outside or penetration of magnetism from the outside can be surely reduced with little increase of the cross section and weight, which is favorable from an environmental point of view.

What is claimed is:

1. A magnetic shielding sheet comprising: a soft magnetic alloy having magnetic shielding characteristics, a thickness less than 100 µm, and flexibility; said alloy being a Fe—Ni series alloy which includes 30 to 85 wt % of Ni, a Fe—Cr—Al series alloy which includes 10 to 17 wt % of Cr and 0.01–5.0 wt % of Al, or a Fe—Co—V series alloy which includes 40–60 wt % of Co and 0.1–5 wt % of V.

2. The magnetic shielding sheet according to claim 1, wherein said Fe—Ni series alloy contains any one or both of less than 8 wt % of Mo and less than 8 wt % of copper.

3. The magnetic shielding sheet according to claim 1, wherein said sheet is made from a Fe—Ni series alloy which includes 78 wt % of Ni, 3 wt % of Mo and less than 8 wt % of Cu, wherein said alloy has a thickness which is less than 10 µm.

4. The magnetic shielding sheet according to claim 1, wherein at least one side of said sheet is laminated with at least any one of an adhesive layer, plastic film, plastic sheet, paper, or corrugated cardboard.

5. The magnetic shielding sheet according to claim 4, wherein said adhesive layer is formed by contacting said sheet with a rotating transfer roller containing said adhesive thereon whereby said adhesive is transferred from said roller to said sheet.

6. The magnetic shielding sheet according to claim 4, wherein said adhesive layer is formed by spraying said adhesive onto said sheet through a nozzle.

7. A cable comprising an electric conductor, an insulating layer around said conductor and a flexible magnetic shielding sheet wrapped around said insulating layer; said flexible magnetic shielding sheet being made of an alloy having magnetic shielding capability, said alloy being in the form of a sheet having a thickness less than 100 µm and said flexible magnetic shielding sheet being wound several turns round said insulating layer.

* * * * *